United States Patent
Dickenson

(10) Patent No.: US 11,782,484 B2
(45) Date of Patent: Oct. 10, 2023

(54) ELECTRONICS BOARD MOUNTING SYSTEM

(71) Applicant: FUJIFILM SonoSite, Inc., Bothell, WA (US)

(72) Inventor: Ken Dickenson, Bellevue, WA (US)

(73) Assignee: FUJIFILM SONOSITE, INC., Bothell, WA (US)

( * ) Notice: Subject to any disclaimer, the term of this patent is extended or adjusted under 35 U.S.C. 154(b) by 0 days.

(21) Appl. No.: 17/514,003

(22) Filed: Oct. 29, 2021

(65) Prior Publication Data
US 2022/0050510 A1     Feb. 17, 2022

Related U.S. Application Data

(63) Continuation of application No. 16/948,890, filed on Oct. 5, 2020, now Pat. No. 11,231,751, which is a
(Continued)

(51) Int. Cl.
*G06F 1/16* (2006.01)
*H05K 1/02* (2006.01)
(Continued)

(52) U.S. Cl.
CPC ......... *G06F 1/1658* (2013.01); *H05K 1/0215* (2013.01); *H05K 1/0296* (2013.01); *H05K 1/181* (2013.01); *H05K 7/142* (2013.01)

(58) Field of Classification Search
CPC ....... G06F 1/16; G06F 1/1658; H05K 1/0215; H05K 1/0296; H05K 1/181; H05K 7/142
(Continued)

(56) References Cited

U.S. PATENT DOCUMENTS 5,519,169 A     5/1996  Garrett et al.
2007/0077794 A1  4/2007  Chen
(Continued)

FOREIGN PATENT DOCUMENTS

JP     62160599 U    10/1987
JP    2001161627 A    6/2001
(Continued)

OTHER PUBLICATIONS

Extended European Search Report on the Patentability of U.S. Appl. No. 19859534.0 dated May 25, 2022, 14 pages.
(Continued)

*Primary Examiner* — Tremesha S Willis
(74) *Attorney, Agent, or Firm* — Womble Bond Dickinson (US) LLP

(57) ABSTRACT

Apparatuses and associated methods for mounting PCBs and other electronics boards in portable medical equipment and/or other portable and non-portable electronic devices are disclosed herein. In some embodiments, the technology disclosed herein can provide PCB mounting systems that isolate the PCB from detrimental shock, vibration, and/or strain, while also providing electrical ground paths that greatly reduce EMI and other electrical disturbances. Some embodiments of the mounting systems described herein include both elastomeric (e.g., rubber) components and resilient metallic grounding members that, when assembled together, provide favorable shock mounting as well as robust electrical grounding without the inconvenience of using separate shock mounts, grounding straps, etc.

19 Claims, 9 Drawing Sheets

Related U.S. Application Data continuation of application No. 16/697,494, filed on Nov. 27, 2019, now Pat. No. 10,802,547, which is a continuation of application No. 16/130,804, filed on Sep. 13, 2018, now Pat. No. 10,496,137.

(51) Int. Cl.
*H05K 7/14* (2006.01)
*H05K 1/18* (2006.01)

(58) Field of Classification Search
USPC ....................................................... 361/748
See application file for complete search history.

(56) References Cited

U.S. PATENT DOCUMENTS

| | | |
|---|---|---|
| 2007/0195532 A1 | 8/2007 | Reisenauer et al. |
| 2009/0298357 A1 | 12/2009 | Tachikawa et al. |
| 2012/0300405 A1 | 11/2012 | Webber et al. |
| 2013/0328741 A1 | 12/2013 | Degner et al. |
| 2014/0198472 A1 | 7/2014 | Qin et al. |
| 2019/0036223 A1 | 1/2019 | Wu et al. |

FOREIGN PATENT DOCUMENTS

| | | |
|---|---|---|
| JP | 2010225929 A | 10/2010 |
| KR | 100455015 | 1/2005 |
| WO | 2009149153 | 12/2009 |

OTHER PUBLICATIONS

International Search Report and Written Opinion for Application No. PCT/US2019/050687, dated Jan. 28, 2020, 11 pages.
International Preliminary Report and Written Opinion on the Patentability of Application No. PCT/US2019/050687 dated Mar. 25, 2021, 8 pages.
Japanese Office Action and Search Report on the Patentability of Application No. 2021-514120 dated Jun. 15, 2022, 4 pages.
Publication of Utility Model Application for Japanese Application No. 62-160599, published Oct. 13, 1987, 13 pages. X=English Abstract Only.

ELECTRONICS BOARD MOUNTING SYSTEM

This application is a continuation application of co-pending U.S. patent application Ser. No. 16/948,890 filed Oct. 5, 2020, which is a continuation application of U.S. patent application Ser. No. 16/697,494 filed Nov. 27, 2019, now issued as U.S. Pat. No. 10,802,547, which is a continuation application of U.S. patent application Ser. No. 16/130,804 filed Sep. 13, 2018, now issued as U.S. Pat. No. 10,496,137, and claims priority of all of the above filing dates.

TECHNICAL FIELD

The present disclosure is generally related to mounting printed circuit boards and other electronics boards in electronic devices and, more particularly, to mounting systems that can reduce physical loads and electromagnetic interference associated with such boards.

BACKGROUND

Electronic medical equipment, such as portable ultrasound imaging devices, and many other electronic processing devices, such as laptop computers, typically include at least one printed circuit board (PCB) that carries a central processing unit (CPU), a graphics processing unit (GPU), a digital signal processor (DSP), and/or other electronic components for operation of the device. For electromagnetic compatibility (EMC) of such devices, it can be important to shield the components on the PCB from electromagnetic interference (EMI) and reduce radiated emissions that can degrade performance during operation. Additionally, especially for portable electronic devices, it can be important to mount the PCB in such a way that it can withstand inadvertent loads resulting from installation and use. Such loads can include, for example, shock loads that can occur if a user inadvertently drops the device. To meet these challenges, conventional electronic devices are often designed and constructed so that they can withstand a drop of, for example, 3 feet, and provide EMI shielding sufficient to meet Federal Communication Commission (FCC) class B regulations.

In some conventional electronic devices, the PCB is mounted to a metal enclosure or chassis with off-the-shelf rubber grommets and isolators in an attempt to mitigate shock loads. Additionally, such devices typically include one or more grounding straps having a first end attached to a perimeter of the PCB and an opposite end attached to the metal enclosure in an attempt to provide sufficient EMI shielding. Off-the-shelf rubber grommets and isolators, however, often provide insufficient shock isolation. Similarly, the use of grounding straps typically provides only limited EMI shielding. Moreover, the use of grounding straps can make it difficult to mount the PCB in the enclosure, especially if multiple ground straps are installed around the perimeter of the PCB. Accordingly, it would be advantageous to provide PCB mounting systems that can provide robust protection from shock, vibration, strain and/or EMI, while also being relatively easy to install.

DETAILED DESCRIPTION

Figure 1A:
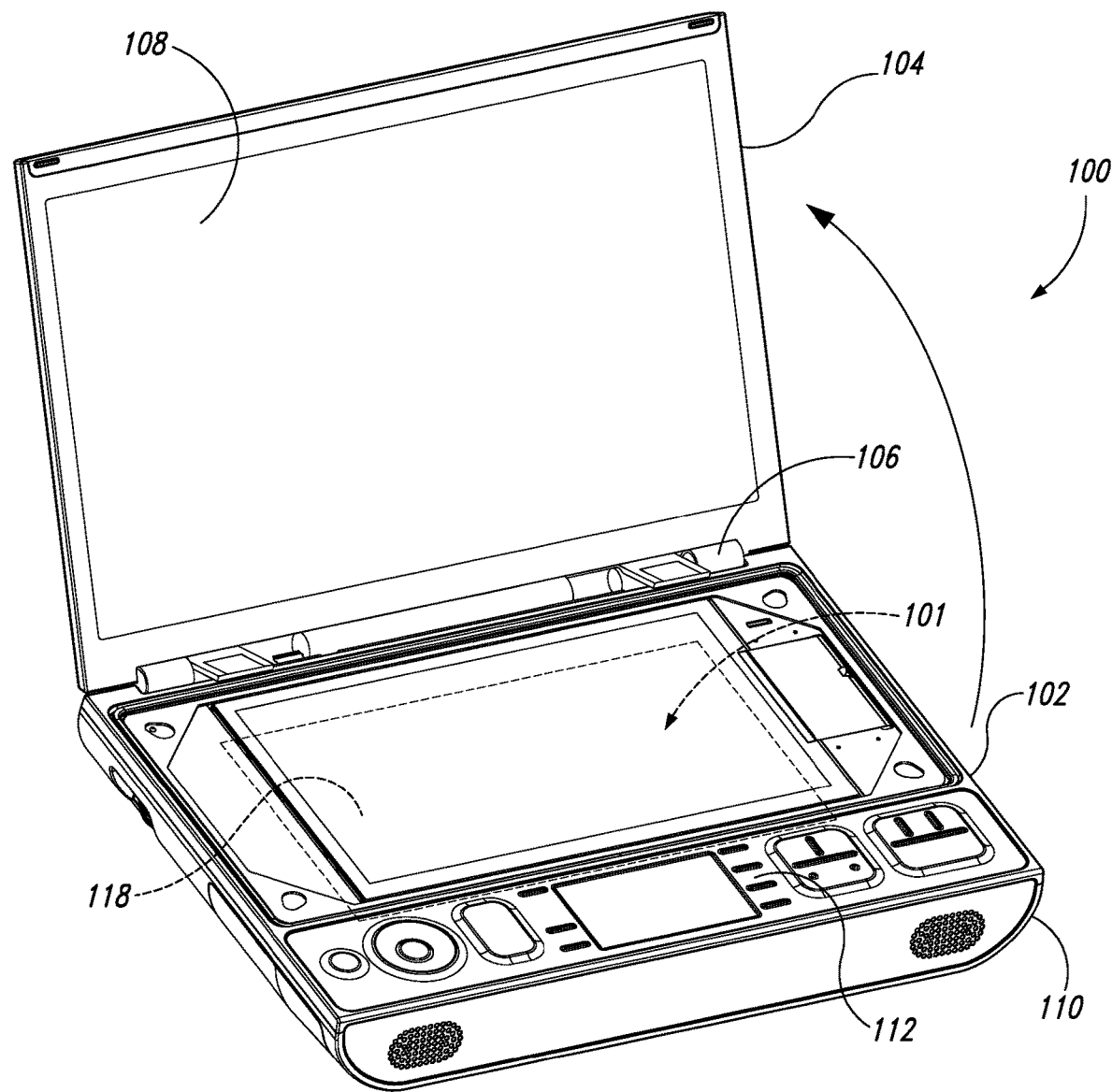
FIG. 1A is an isometric view of a portable electronic device having an electronics board mounting system configured in with accordance with embodiments of the present technology.

The following disclosure describes various embodiments of apparatuses, systems and methods for mounting PCBs and other circuit boards in electronic devices. As described in greater detail below, in some embodiments the apparatuses, methods and systems described herein can be used to mount PCBs in portable medical equipment and other electronic devices in such a way that the PCB and its components are protected against performance-degrading EMI, radiated emissions, and inadvertent shock, vibration, and/or strain loads.

Certain details are set forth in the following description and in FIGS. 1A-4B to provide a thorough understanding of various embodiments of the present technology. In other instances, well-known structures, materials, operations and/or systems often associated with printed circuit boards, electronic device enclosures, ultrasound imaging systems and other medical equipment, etc. are not shown or described in detail in the following disclosure to avoid unnecessarily obscuring the description of the various embodiments of the technology. Those of ordinary skill in the art will recognize, however, that the present technology can be practiced without one or more of the details set forth herein, or with other structures, methods, components, and so forth. The terminology used below is to be interpreted in its broadest reasonable manner, even though it is being used in conjunction with a detailed description of certain examples of embodiments of the technology. Indeed, certain terms may even be emphasized below; however, any terminology intended to be interpreted in any restricted manner will be overtly and specifically defined as such in this Detailed Description section.

The accompanying Figures depict embodiments of the present technology and are not intended to be limiting of its scope. The sizes of various depicted elements are not necessarily drawn to scale, and these various elements may be arbitrarily enlarged to improve legibility. Component details may be abstracted in the Figures to exclude details such as position of components and certain precise connections between such components when such details are unnecessary for a complete understanding of how to make and use the invention.

Many of the details, dimensions, angles and other features shown in the Figures are merely illustrative of particular embodiments of the disclosure. Accordingly, other embodiments can have other details, dimensions, angles and features without departing from the spirit or scope of the present invention. In addition, those of ordinary skill in the art will appreciate that further embodiments of the invention can be practiced without several of the details described below. In the Figures, identical reference numbers identify identical, or at least generally similar, elements. To facilitate the discussion of any particular element, the most significant digit or digits of any reference number refers to the Figure in which that element is first introduced. For example, element 110 is first introduced and discussed with reference to FIG. 1A.

Figure 1B:
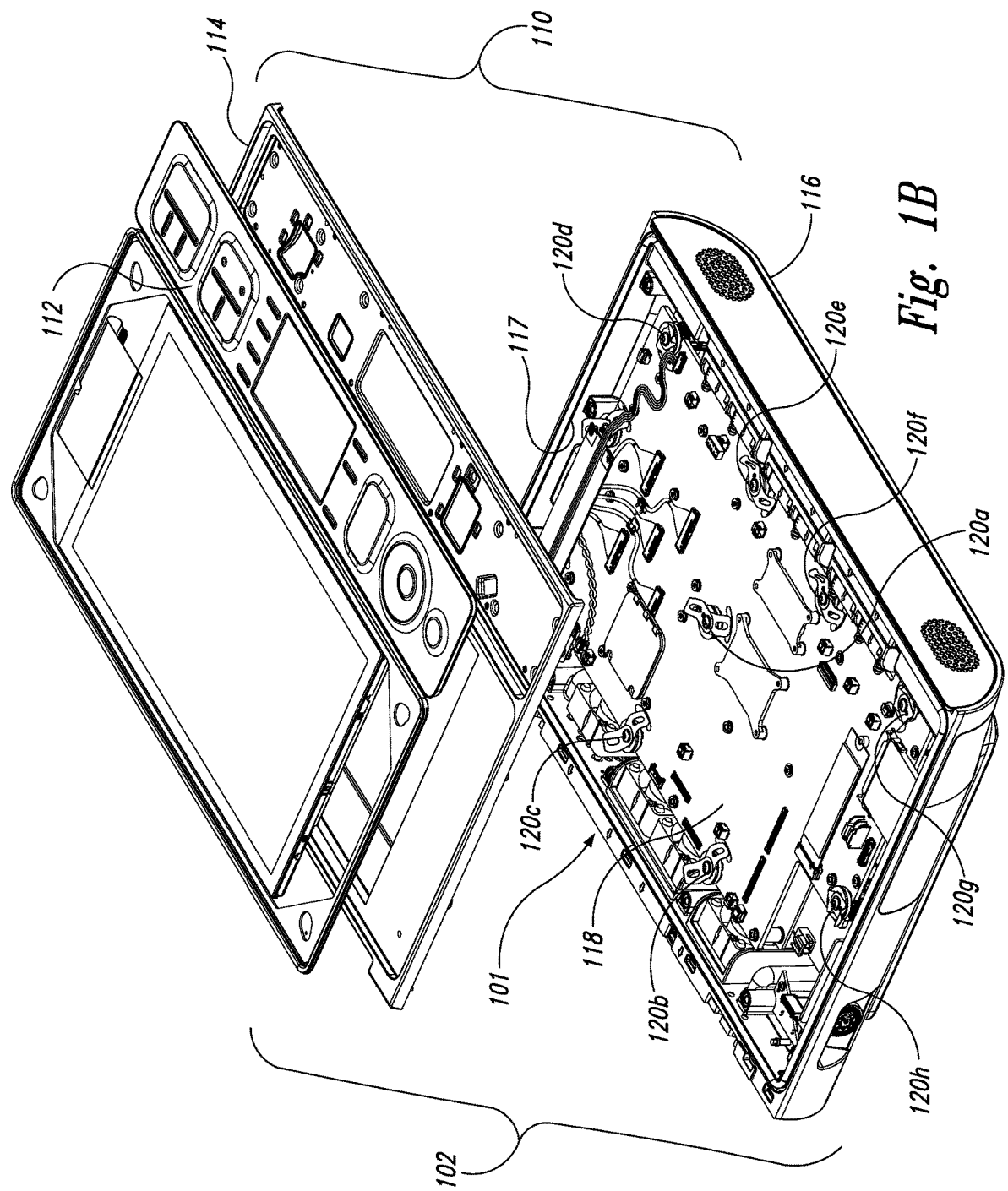
FIG. 1B is a partially exploded isometric view of the electronic device illustrating aspects of the electronics board mounting system in more detail.

FIG. 1A is an isometric view of an electronic device 100 having an electronics board mounting system 101 configured in accordance with embodiments of the present technology. FIG. 1B is a partially exploded isometric view of the electronic device 100 illustrating aspects of the electronics board mounting system 101 in more detail. Referring first to FIG. 1A, in some embodiments the electronic device 100 can be a portable electronic device, such as a portable medical device (e.g., a portable ultrasound imaging device). It should be noted, however, that the electronics board mounting system 101 described herein is not limited to use with portable electronic devices, portable medical devices, or any other type of electronic device, but is usable with virtually any type of processing or other electronic device that contains a PCB or other electronics board mounted therein.

In the illustrated embodiment, the electronic device 100 includes a first or lower portion 102 that is pivotably connected to a second or upper portion 104 in a clamshell configuration by means of a hinge 106 extending along a rear edge portion thereof. In some embodiments, the upper portion 104 can include a display (e.g., an LCD or LED), that can display graphical, textual, and/or other images (e.g., ultrasound images) when the upper portion 104 is rotated to the open position shown in FIG. 1A. In some embodiments, the lower portion 102 can include a control panel 112 containing various user-input devices (e.g., a touchpad, a keypad, buttons, knobs, etc.) for receiving various types of user input for controlling operation of the device 100. Additionally, as described in greater detail below, the lower portion 102 can also include an electronics board 118 that is shock-mounted within an enclosure 110 (which can also be referred to as a housing or chassis 110) and electrically grounded thereto by means of the electronics board mounting system 101 ("mounting system 101"). In the illustrated embodiment, the electronics board 118 is a PCB that carries, for example, one or more CPUs, GPUs, DSPs, memory, and/or other processing and/or electronic devices and circuitry for operation of the device 100 in a conventional manner. In other embodiments, however, the electronics board 118 can be other types of circuit boards or similar substrates that carry processing and/or other electronic components in electronic devices that may be susceptible to shock, vibration, strain and/or EMI during assembly, use, etc. Accordingly, the term "electronics board" is used herein to refer generally to PCBs and other structures that mechanically support and/or electrically connect electronic components.

Referring next to FIG. 1B, in some embodiments the enclosure 110 includes a first or lower cover 116 and a second or upper cover 114. In the illustrated embodiment, the lower cover 116 has the form of a generally rectangular housing having a generally rectangular opening 117 in an upper portion thereof, and the upper cover 114 has the form of a generally flat panel having a rectangular shape configured to cover the opening 117. In other embodiments, however, the upper and lower covers 114 and 116 and variations thereof can have other configurations. For example, in other embodiments the upper cover 114 can also be in the form of 3-dimensional housing or enclosure, like the lower cover 116. In some embodiments, both the upper cover 114 and the lower cover 116 can be formed (e.g., cast, machined, etc.) from conductive materials, such as metallic materials (e.g., magnesium, aluminum, etc.) which are well known in the art and often used for electronic device enclosures.

Although not shown in FIG. 1B, in some embodiments the lower cover 116 can include a plurality of integrally-formed conductive risers or bosses that extend upwardly from an interior surface of the lower cover 116 toward the opening 117. The electronics board 118 is mounted to the bosses within the lower cover 116 by a plurality of individual mounting assemblies 120 (identified individually as mounting assemblies 120*a-h*). Once the electronics board 118 has been mounted to the lower cover 116 as shown in FIG. 1B, the upper cover 114 can be positioned over the opening 117 and secured around the periphery thereof to secure the electronics board 118 within the enclosure 110. In some embodiments, the conductive upper and lower covers 114 and 116 form a Faraday cage around the electronics board 118 that completely encloses, or at least substantially encloses, the electronics board 118. As is known, the Faraday cage can block, or at least substantially attenuate, electromagnetic fields from entering the enclosure 110 and causing EMI that can degrade performance of the electronic components mounted to the electronics board 118. As described in greater detail below, in some embodiments the mounting assemblies 120 can substantially isolate the electronics board 118 from shock, vibration and strain, while also providing electrical grounding paths to the lower cover 116 and the upper cover 114 that enhance EMI protection.

Although both the upper and lower covers 114 and 116 of the illustrated embodiment are formed from conductive metal, in other embodiments the electronic device 100 can include an outer cover formed from plastic or another non-conductive material, and the electronics board 118 can be enclosed, or at least partially enclosed, within an electrically conductive internal enclosure (e.g., a metallic mesh enclosure) positioned within the outer plastic cover. In such embodiments, the internal conductive enclosure can provide EMI protection, and the mounting assembly 120 can be used as described herein to provide grounding paths from the electronics board 118 to the internal enclosure.

Figure 2A:
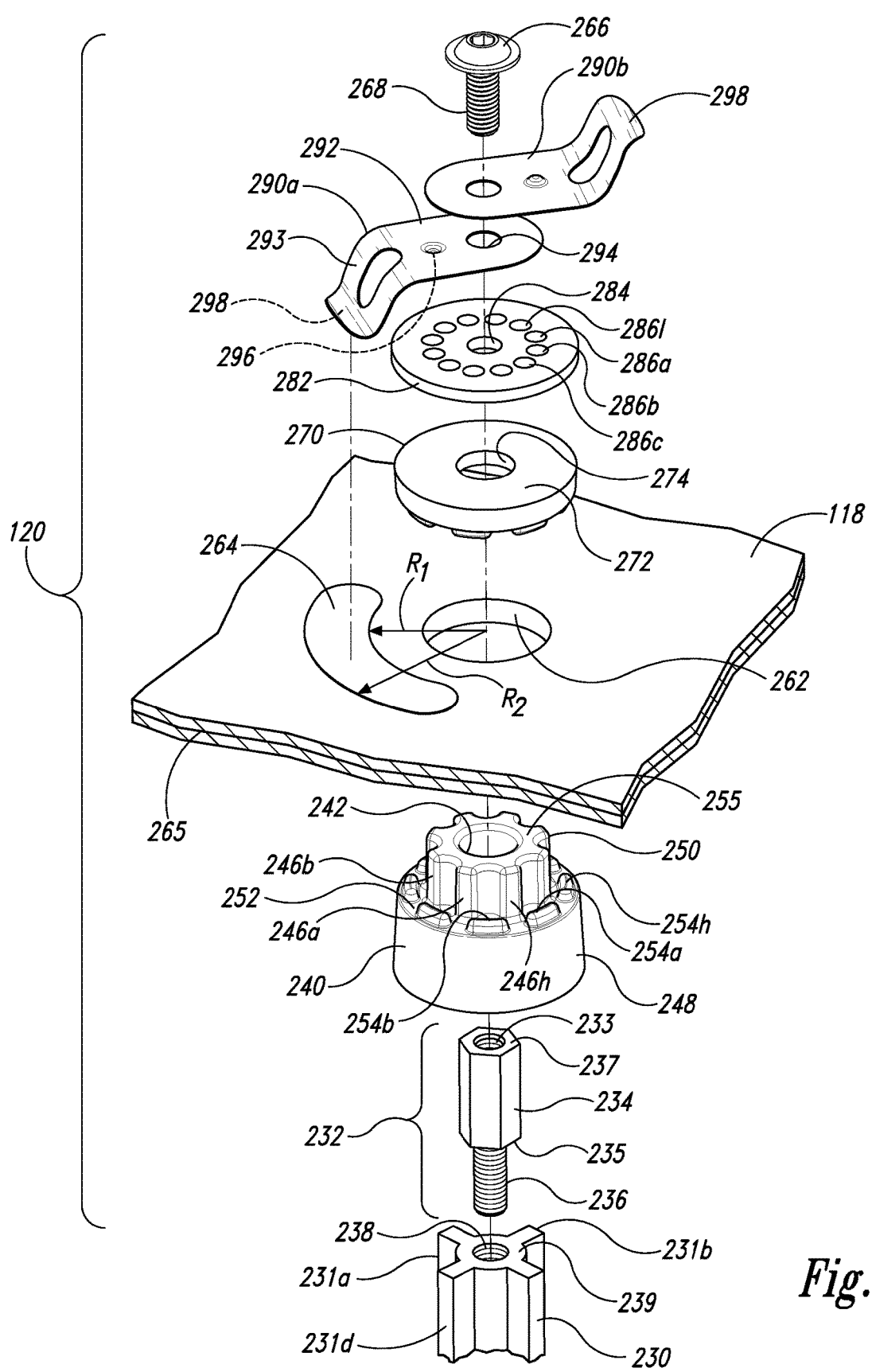
FIG. 2A is an exploded isometric view of an electronics board mounting assembly configured in accordance with embodiments of the present technology.
Figure 2B:
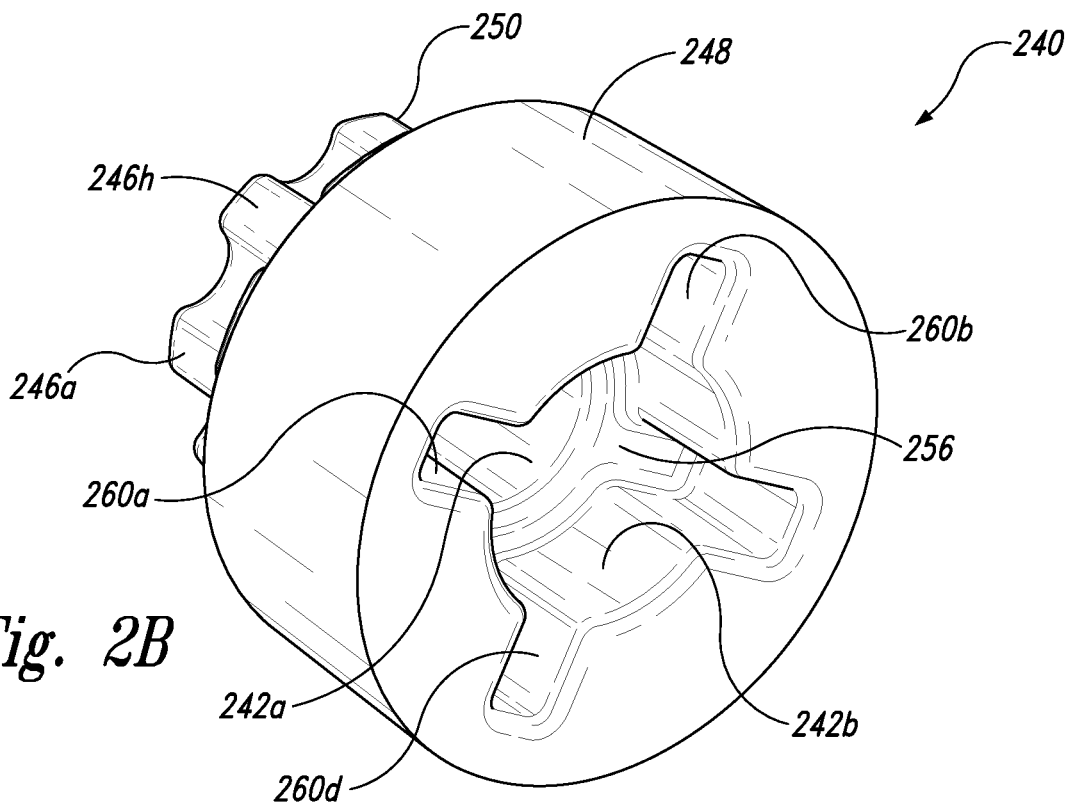
FIG. 2B is an enlarged isometric view of a first support member of the mounting assembly of FIG. 2A.
Figure 2C:
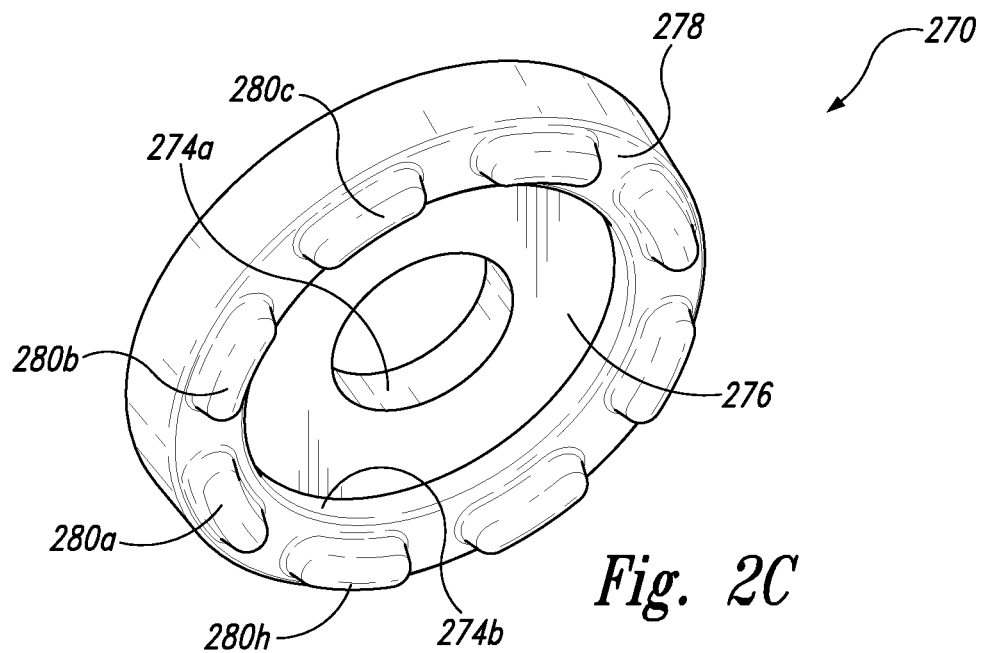
FIG. 2C is an enlarged isometric view of a second support member of the mounting assembly of FIG. 2A.

FIG. 2A is an exploded isometric view of one of the mounting assemblies 120 of FIG. 1B configured in accordance with embodiments with the present technology. FIGS. 2B and 2C are enlarged bottom isometric views of a first support member 240 and a second support member 270 of the mounting assembly 120, respectively, configured in accordance with embodiments with the present technology. Although only one of the mounting assemblies 120 is shown in FIG. 2A, in the illustrated embodiment all of the mounting assemblies 120 are identical, or at least substantially identical and, accordingly, the description that follows applies to all the mounting assemblies 120 shown in FIG. 1B.

Referring first to FIG. 2A, as noted above in the discussion of FIG. 1B, each of the mounting assemblies 120 is operably mounted to a corresponding conductive boss 230 that extends upwardly from an interior surface of the lower cover 116 (FIG. 1B). In the illustrated embodiment, the boss 230 is integrally formed (e.g., cast) with the lower cover 116 and accordingly formed from the same conductive material. In other embodiments, the boss 230 can be formed separately from the lower cover 116 and attached thereto by a suitable bracket, fastener, adhesive, weld, etc. The boss 230 includes a threaded fastener hole 238, which is centrally located in an upper surface 239. In some embodiments, the boss 230 can also include structural features for strength or stiffness, such as one or more ribs 231 (identified in individually as ribs 231a-d) that extend radially outward from the boss 230 at equal (e.g., 90 degree) spacings.

In some embodiments, the mounting assembly 120 further includes a stand-off 232 and a first support member 240. The stand-off 232 can include a hexagonal head portion 234 and a threaded portion 236 separated by a shoulder 235. An upper surface 237 of the hexagonal portion 234 includes a threaded fastener hole 233. The stand-off 232 can be made from a suitable conductive material, such as a conductive metal (e.g., mild steel).

In some embodiments, the first support member 240 (which can also be referred to as a first isolator) can include an exterior shoulder 252 concentrically positioned between a bushing portion 250 and a broader base portion 248. In some embodiments, the bushing portion 250 includes a plurality of deformable features 246 (e.g., elastically deformable features; identified individually as deformable features 246a-h) that project radially outward at even circumferential spacing around the bushing portion 250. In the illustrated embodiment, the deformable features 246 have the form of longitudinal ridges with generally flat or "squared-off" outer edge portions. In other embodiments, however, the deformable features 246 can have other shapes and sizes, such as ridge shapes with rounded outer edge portions, or one or more of the deformable features 246 can be omitted. In some embodiments, the support member 240 can also include a plurality of deformable features 254 (e.g., elastically deformable features; identified individually as deformable features 254a-h) that extend upwardly at even circumferential spacing around the shoulder 252. In the illustrated embodiment, the deformable features 254 have the form of protruding surface portions or raised "bumps" with an inverted "U" cross-sectional shape. In other embodiments, the deformable features 254 can have other shapes, sizes and/or spacings, or one or more of the deformable features 254 can be omitted.

Referring to FIG. 2A together with FIG. 2B, the first support member 240 further includes a central through hole 242 extending from an upper surface 255. In some embodiments, the through hole 242 includes a first or upper through hole portion 242a separated from a larger-diameter second or lower through hole portion 242b by an interior shoulder 256. As shown in FIG. 2B, the lower through hole portion 242b includes a plurality of channels or grooves 260 (identified individually as grooves 260a-d) extending radially outward at equal circumferential spacing. As described in greater detail below, the grooves 260a-d are configured to fit over the ribs 231a-d of the boss 230.

Referring next to FIG. 2A together with FIG. 2C, the mounting assembly 120 further includes a second support member 270 and an end plate or washer 282. The second support member 270 (which can also be referred to as a second isolator) includes a central through hole 274 extending from a first or upper surface 272 to a second or lower surface 278. In some embodiments, the through hole 274 includes a first or upper through hole portion 274a separated from a larger-diameter second or lower through hole portion 274b by an interior shoulder 276. As best seen in FIG. 2C, the second support member 270 can further include a plurality of deformable features 280 (e.g., elastically deformable features; identified individually as deformable features 280a-h) projecting downwardly at even spacing around the lower surface 278. In some embodiments, the deformable features 280 are identical, or at least generally similar in size, shape and placement, to the deformable features 256 on the opposing shoulder 252 of the first support member 240. In other embodiments, however, the deformable features 280 can have different shapes, sizes, and/or spacings, etc., and in yet other embodiments, one or more of the deformable features 280 can be omitted.

In some embodiments, the first support member 240 and the second support member 270 can be formed from a resilient and/or elastic material, such as synthetic or natural rubber and/or other elastomeric materials, that can elastically deform (e.g., elastically compress; or at least partially elastically compress) in response to external forces. For example, in some embodiments the first support member 240 and the second support member 270 can be formed from silicone, such as silicone having a Shore A hardness of 20-98 durometer, 30-90 durometer, or 40-80 durometer. In other embodiments, the first support member 240 and the second support member 270 can be made from other elastomers and/or other suitably elastic and/or resilient materials. Accordingly, it will be understood that embodiments of the first support member 240 and the second support member 270 are not limited to any particular material unless expressly stated herein, and can generally be made from virtually any material that can deflect and/or elastically deform to absorb static and/or dynamic loads from shock, vibration, stress, strain, etc.

In some embodiments, the washer 282 can include a plurality of recesses 286 (identified individually as recesses 286a-l) circumferentially positioned at equal spacing around a central through hole 284. In the illustrated embodiment, the recesses 286 are formed by corresponding through holes positioned at 30 degree intervals around the central through hole 284. In other embodiments, the washer 282 can include more of fewer of the recesses 286 at different spacings. Although the recesses 286 are formed by through holes in the illustrated embodiment (use of through holes simplifies manufacture and use of the washer 282), in other embodiments the recesses 286 can be formed by dimples, grooves, and/or other features, and in some embodiments, the recesses 286 can be omitted. In some embodiments, the washer 292 can be formed from a suitable conductive metal, such as beryllium copper, mild steel, etc., and can have the same diameter, or at least approximately the same diameter, as the second support member 270. In other embodiments, the washer 282 can have other shapes and sizes, and can be made from other suitable materials.

In some embodiments, the mounting assembly 120 further includes a first grounding member 290a, a second grounding member 290b, and a fastener 266. In the illustrated embodiment, the first grounding member 290a includes a distal portion 293 that extends at an angle from a base portion 292. The base portion 292 includes a through hole 294 and a "bump" or rounded protrusion 296 that projects downwardly toward the washer 282. More specifically, the protrusion 296 is located the same radial distance from the through hole 294 as the recesses 286 are located from the through hole 284 in the washer 282. The distal portion 293 of the first grounding member 290a includes a tip portion having a contact surface 298 that is formed to extend outwardly generally parallel to the base portion 292. In the illustrated embodiment, the second grounding member 290b can be identical, or at least general similar in structure and function to the first grounding member 290a, with the exception that the second grounding member 290b can be flipped over 180 degrees so that the distal contact surface 298 projects upwardly from the corresponding base portion 292 as shown in FIG. 2A.

In some embodiments, the grounding members 290 can be formed from a relatively thin conductive metal sheet material that exhibits resilient or spring-like qualities while also being electrically conductive. For example, in some embodiments the grounding members 290 can be formed from beryllium copper sheet, such as beryllium copper sheet having a thickness of from 0.0005 inch to 0.025 inch, from 0.001 inch to 0.018 inch, or from 0.005 inch to 0.012 inch. In other embodiments, the grounding members 290 (which can also be referred to as "fingers," "conductive fingers," "conductive contracts," etc.) can be formed from other suitable electrically conductive materials having suitable resiliency to return to their original shape after the contact tip surface 298 has been deflected.

The electronics board 118 includes a through hole 262 configured to receive the bushing portion 250 of the first support member 240. Although the through hole 262 is depicted as a complete circular hole in FIG. 2A, it should be noted that some embodiments the mounting assembly 120 can be used at or near an edge of the electronics board 118, in which case the through hole 262 may only form a portion of a circular hole in the electronics board 118. In some embodiments, the through hole 262 can have the same diameter, or at least approximately the same diameter, as the bushing portion 250. In other embodiments, the through hole 262 can be configured to provide a clearance fit for the bushing portion 250 (e.g., a fit in which the through hole 262 is slightly larger (e.g., 0.0005 to 0.030 inch larger) than the outer diameter of the bushing portion 250. In still further embodiments, the through hole 262 can be configured to provide an interference fit for the bushing portion 250 (e.g., a fit in which the though hole 262 is smaller (e.g., 0.0005 to 0.010 inch smaller) than the bushing portion 250.

The electronics board 118 can further include a grounding pad 264 positioned proximate to the through hole 262. In the illustrated embodiment, the grounding pad 264 provides a conductive surface that extends through an arch of from about 10 degrees to about 140 degrees, or about 80 degrees around the through hole 262. In other embodiments, the grounding pad 264 can extend completely around the through hole 262. The grounding pad 264 can be shaped to have a first radius R1 and a second radius R2 that are selected to position the contact surface 298 of the first grounding member 290a generally in the radial center of the grounding pad 264. In some embodiments, the grounding pad 264 can be laminated onto or into the surface of the electronics board 118 to provide a conductive contact surface that is readily accessible by the contact surface 298 of the first grounding member 290a. For example, in some embodiments the grounding pad 264 can be made from a suitable conductive foil, such as a gold-over-copper foil well known in the manufacture of PCBs and other circuit boards. Additionally, the grounding pad 264 can be electrically connected through one or more ground paths (not shown) to one or more ground planes 265 in the electronics board 118. In some embodiments, the ground plane 265 can be formed in or on the surface of the electronics board 118 in a conventional manner, and can be comprised of copper foil or other suitable materials well known in the art.

Figure 3A:
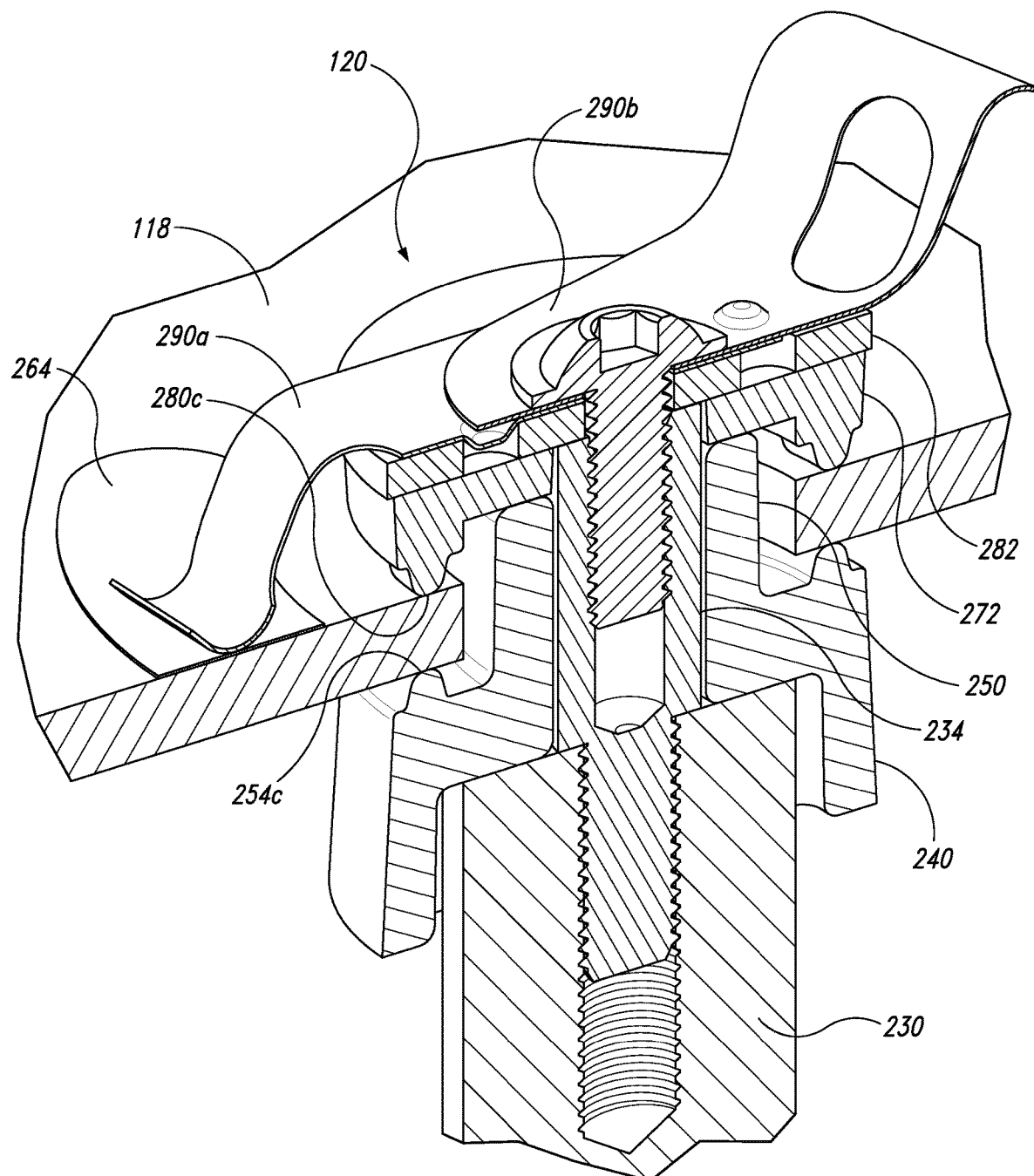
FIG. 3A is a cross-sectional isometric view of the mounting assembly of FIG. 2A, and FIGS. 3B-3D are a series of isometric views illustrating various stages of mounting a circuit board to an enclosure with the mounting assembly of FIG. 2A, in accordance with embodiments of the present technology.
Figure 3B:
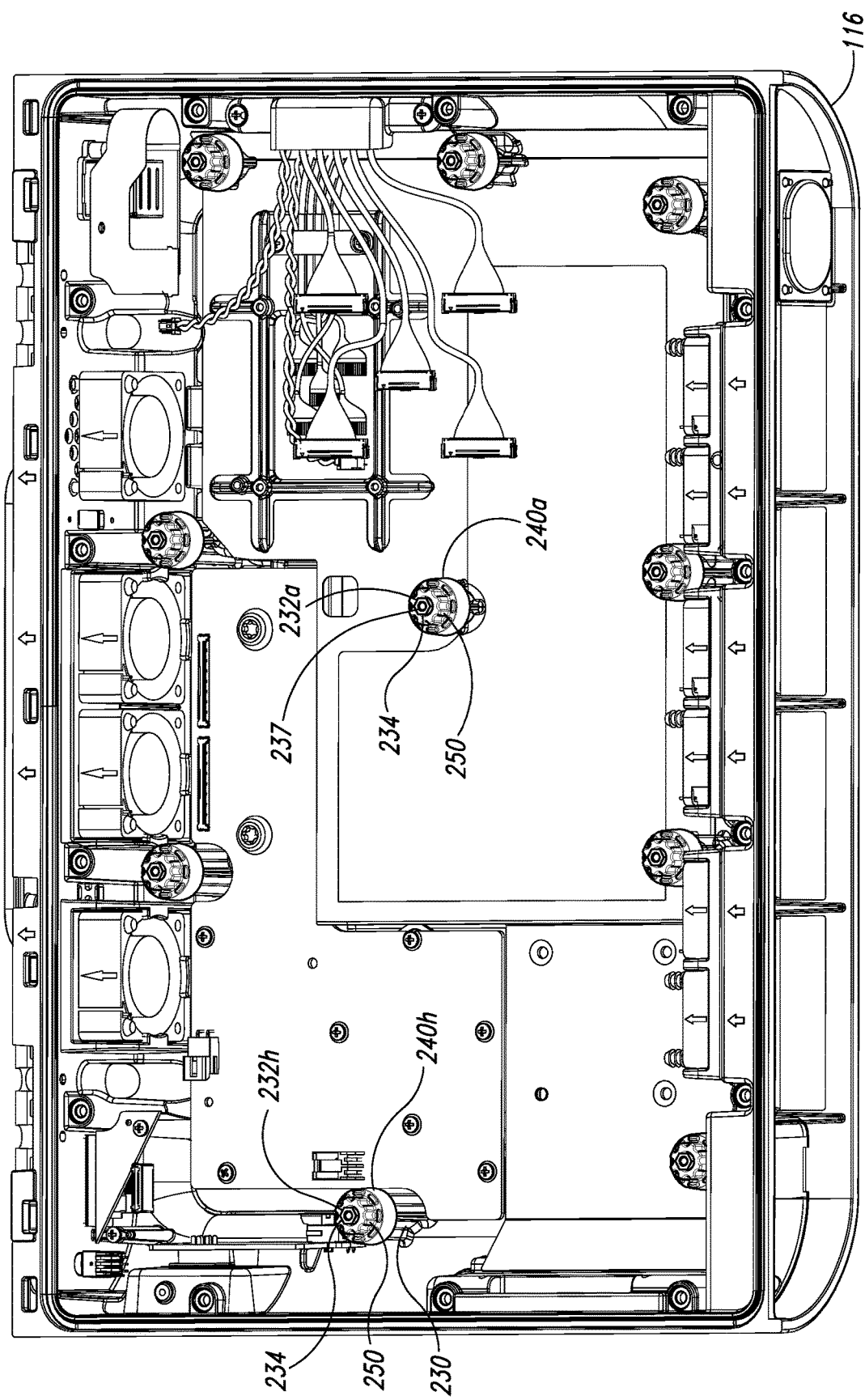
Figure 3C:
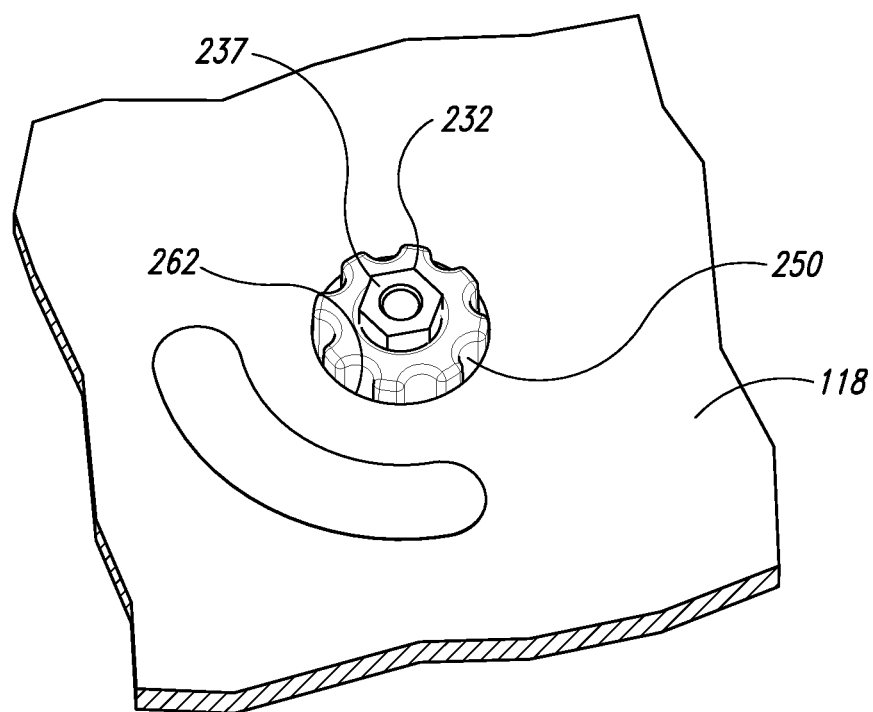
Figure 3D:
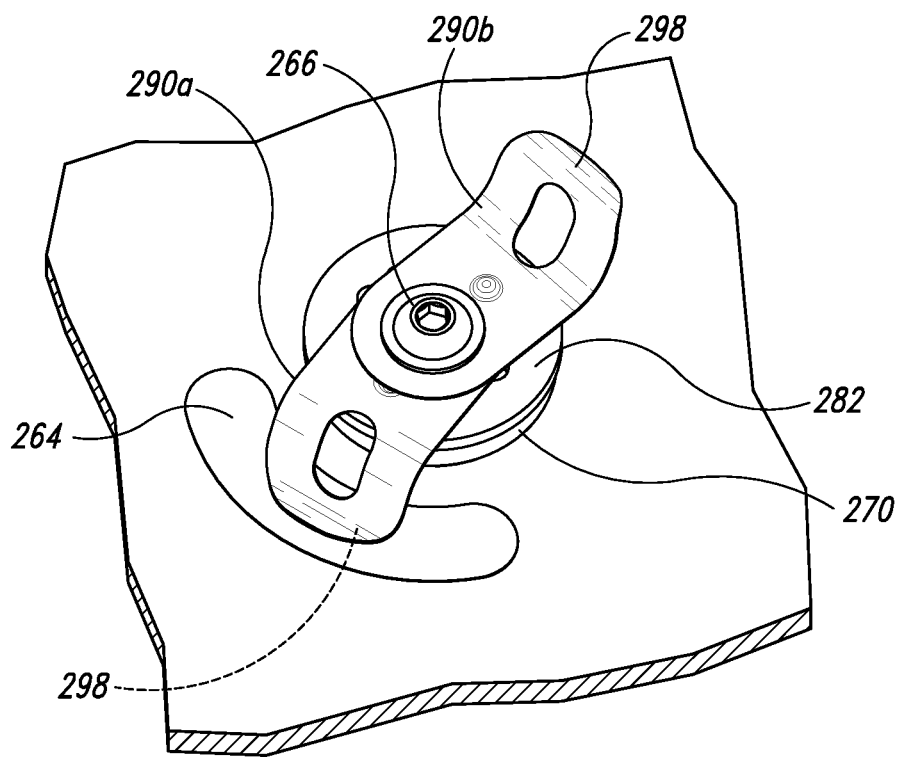

FIG. 3A is an isometric cross-sectional view of the assembled mounting assembly 120 at one of the mounting locations of the electronics board 118 in accordance with the embodiments of the present technology. FIGS. 3B-3D are a series of top isometric views illustrating various stages of installing the electronics board 118 in the enclosure 110 (FIG. 1B) in accordance with embodiments of the present technology. Referring to FIG. 3A together with FIG. 2A, to assemble the mounting assembly 120 and install the electronics board 118 in the enclosure 110, the threaded portion 236 of the stand-off 232 is threadedly inserted into the threaded hole 238 in the boss 230. The hexagonal portion 234 of the stand-off 232 can facilitate tightening of the stand-off 232 into the boss 230. After the stand-off 232 has been attached to the boss 230, the first support member 240 is positioned over the stand-off 232 so that the ribs 231a-d of the boss 230 are received in the grooves 260a-d of the first support member 240 (FIG. 2B), and the upper surface 239 of the boss 230 contacts the shoulder 256 of the first support member 240 (also FIG. 2B). When the first support member 240 is in this position, the upper surface 237 of the stand-off 232 protrudes slightly above the adjacent upper surface 255 of the bushing portion 250, as shown in, for example, FIGS. 3A and 3C.

FIG. 3B illustrates a stage in the installation of the electronics board 118 in which a plurality of the stand-offs 232 (identified individually as stand-offs 232a-h) and a plurality of the first support members 240 (identified individually as first support members 240a-240h) have been mounted to corresponding bosses 230 in the manner described above. Next, the electronics board 118 is positioned over the first support members 240 so that each of the bushing portions 250 is received in a corresponding one of the openings 262 in the electronics board 118 as shown in, for example, FIGS. 3A and 3C. Next, the second support member 270 is positioned over the first support member 240 so that the bushing portion 250 of the first support member 240 contacts the interior shoulder 276 on the second support member 270 (FIGS. 2C and 3A). At this stage, the hexagonal portion 234 of the stand-off 232 extends at least partially through the upper through hole portion 274a of the second support member 270 so that the upper surface 237 of the stand-off 232 is positioned flush with, or just slightly below, the upper surface 272 of the second support member 270 (FIGS. 2A, 2C and 3A).

Next, the washer 282 is centrically positioned over the second support member 270, followed by the first grounding member 290a and the second grounding 290b. The threaded portion 268 of the fastener 266 is then inserted through the through holes 294 and 284 and threadedly inserted into the threaded hole 233 in the stand-off 232, as shown in FIG. 3A. Before the fastener 266 is fully tightened, however, the first grounding member 290a can be rotated in either direction about the fastener 266 to position the contact surface 298 in direct, intimate contact with the grounding pad 264 on the electronics board 118, as shown in, for example, FIG. 3D. Additionally, the second grounding member 290b can also be rotated into a favorable position so that its contact surface 298 will make direct and intimate contact with an adjacent interior surface of the upper cover 114 of the enclosure 110 (FIG. 1B) once the upper cover 114 has been installed on the lower cover 116. Once the first and second grounding members 290 have been rotated into the desired angular positions, the fastener 266 can be fully tightened. Doing this holds the protrusion 296 on the first grounding member 290a in the corresponding opening 286 in the washer 282, to thereby maintain the first grounding member 290a in the desired angular position. After the electronics board 118 has been fully mounted to the lower cover 116, the upper cover 114 can be secured over the opening 117 in the lower cover 116 (FIG. 1B).

As shown in FIG. 3A, when the fastener 266 is fully tightened the washer 282 is brought firmly to bear against the upper surface 237 of the stand-off 232, and the first and second support members 240 and 270, respectively, are slightly compressed between the washer 282 and the boss 230. As a result, the electronics board 118 is compressed between the deformable features 254 on the first support member 240 (FIG. 2A) on the bottom side, and the deformable features 280 on the second support member 270 (FIG. 2C) on the top side. However, because of their elastic compressibility, the first support member 240 and the second support member 270 provide an elastic mounting arrangement for the electronics board 118 that can greatly attenuate shock loads on, and/or dampen vibration of, the electronics board 118 resulting from, for example, the electronic device 100 (FIG. 1A) being inadvertently dropped by a user. Additionally, the compliant nature of the first support member 240 and the second support member 270 also enables them to reduce strain on the electronics board 118 (and associated stress) that can occur during installation (because of, e.g., misalignment of the mounting bosses 230, manufacturing tolerances, etc.), and/or during use (because of, e.g., thermal loads, device mishandling, etc.). By way of example only, in some embodiments the first support member 240 and the second support member 270 can enable upward and downward movement of the electronics board 118 (i.e., movement perpendicular to the electronics board 118) of up to 0.075 inch, or up to 0.050 inch, without sustaining damage. By way of another example, in some embodiments the deformable features 246 on the bushing portion 250 (in combination with other features of the first support member 240 and the second support member 270; FIG. 2A) can enable lateral movement of the electronics board 118 (i.e., side-to-side movement in the plane of the electronics board 118) of up to 0.200 inch, or up to 0.160 inch, without sustaining damage.

Another aspect of the present technology is that, in some embodiments, the compliance of the grounding members 290 can be matched, or at least approximately matched, to the compliance of the first and second support members 240 and 270, respectively. Matching compliances in this manner can ensure that the first grounding member 290a maintains conductive contact with the grounding pad 264, and the second grounding member 290b maintains conductive contact with the upper cover 114, even while the electronics board 118 may be moving or vibrating in response to, for example, extreme shock loads. For example, in some embodiments the first grounding member 290a can be formed so that, as the fastener 266 is fully tightened, the grounding pad 264 contacts the contact surface 298 and causes the distal portion 293 of the grounding member 290a to deflect upwardly a preset amount (e.g., 0.10 inch or less, or 0.080 inch or less). This deflection "preloads" the first grounding member 290a, and enables the contact surface 298 to maintain contact with the grounding pad 264 in harsh vibratory environments, even if the electronics board 118 moves away from the grounding member 290a in response to, for example, an extreme shock load. Similarly, the second grounding member 290b can be formed so that an interior surface portion of the upper cover 114 contacts the contact surface 298 of the second grounding member 290b as the upper cover 114 is installed on the lower cover 116, causing the distal portion 293 of the second grounding member 290b to deflect downwardly a preset amount (e.g., 0.080 inch or less) when the upper cover 114 is fully installed. This preset deflection enables the contact surface 298 of the second grounding member 290b to maintain contact with the upper cover 114, even in harsh vibratory environments. By maintaining conductive contact between the first grounding member 290a and the grounding pad 264, and between the second grounding member 290b and the upper cover 114, the mounting assembly can ensure that the Faraday cage around the electronics board 118 is maintained and performance is not degraded, even in extreme use conditions.

There are a number of other advantages associated with the embodiments of the present technology. For example, in some embodiments using multiple of the mounting assemblies 120 around not just the perimeter but also the interior portion of the electronics board 118 (at, e.g., spacings of about 3-4 inches) provides a multi-point shock mounting system that can substantially reduce potentially detrimental loads on the electronics board 118 resulting from shock and vibration (e.g., from being dropped), as well as strained, (e.g., strain resulting from manufacturing tolerances, etc.). Moreover, the multi-point mounting assemblies also provide multiple ground locations to both the top and bottom surfaces of the Faraday cage provided by the upper cover 114 and the lower cover 116 (FIG. 1B). More specifically, in some embodiments the first grounding member 290a provides a direct ground path from the corresponding grounding pad 264 (and thus the electronics board ground plane 265) to the lower cover 116 by means of the boss 230. Moreover, the first grounding member 190a also provides a portion of the ground path from the grounding pad 264 to the upper cover 114 by means of the second grounding member 190b, which provides direct contact to the upper cover 114 via the contact surface 298 of the second grounding member 190b. These ground paths are substantially shorter than conventional EMI ground paths provided by, for example, grounding straps which are typically attached only around the perimeter of a circuit board. Moreover, embodiments of the present technology can greatly simplify the installation of the electronics board 118 by discarding the grounding straps and associated fasteners of the prior art, and instead provide direct grounding to both the upper and lower surfaces of the Faraday cage by means of the first and second grounding members 290a and 290b, respectively, as described above.

Figure 4A:
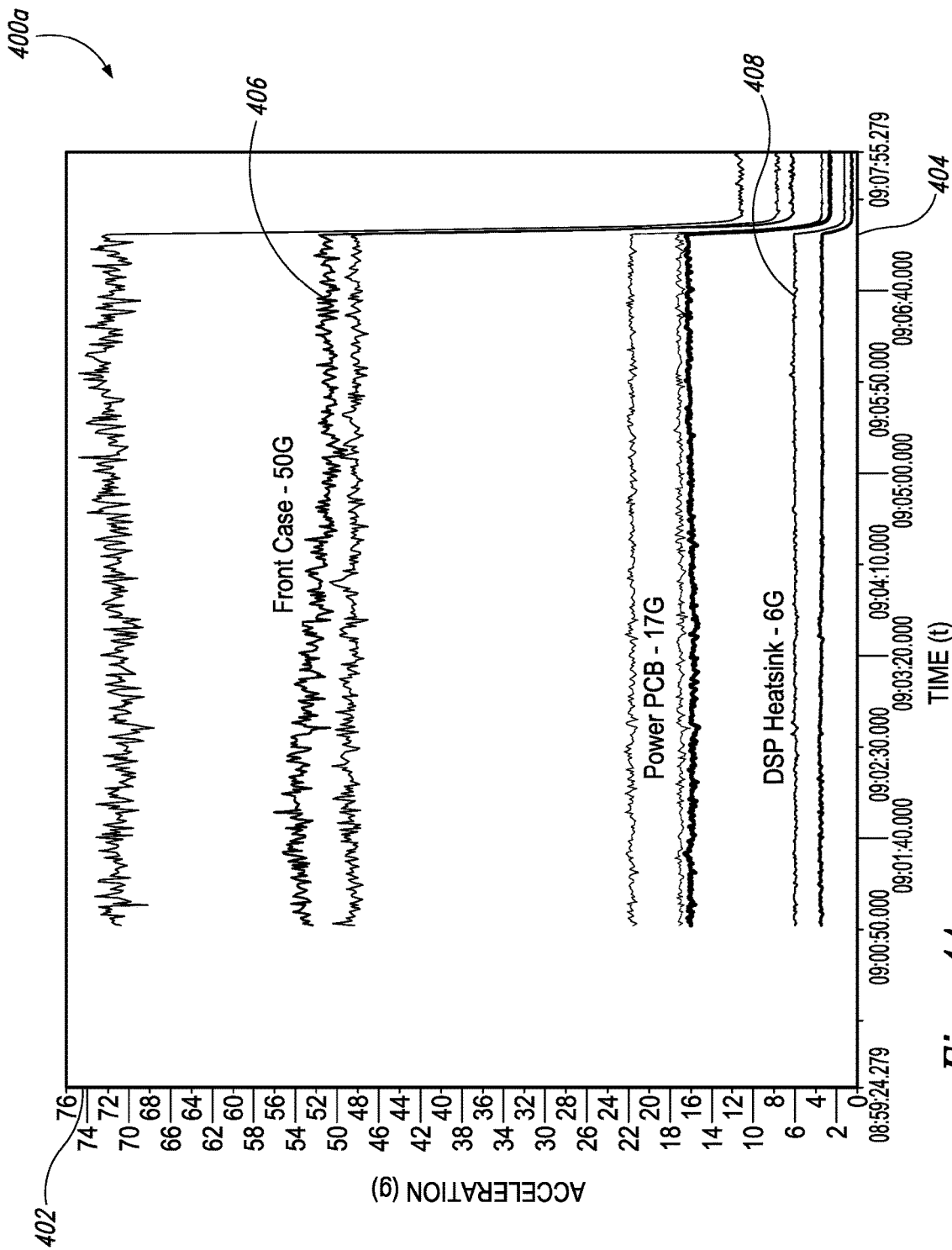
FIG. 4A is a graph illustrating vibrational damping test results of the electronics board mounting system of FIGS. 1A and 1B in accordance with embodiments of the present technology.

FIG. 4A is a graph 400a illustrating vibrational damping test results of the electronics board mounting system 101 (FIGS. 1A and 1B) configured in accordance with embodiments of the present technology. A vertical axis 402 of the graph 400a measures accelerations in g's (g), and a horizontal axis 404 measures time in seconds (s). In this particular test, the enclosure 110 of the device 100 (FIGS. 1A and 1B) was excited at a level of 50 g's, as illustrated by a first plot line 406. As a second plot line 408 shows, however, a heat sink mounted to the electronics board 118 within the enclosure 110 only experienced a vibration level of 6 g's, even though the outer enclosure 110 was vibrating at a level of 50 g's. Accordingly, the graph 400a illustrates that mounting the electronics board 118 to the enclosure 110 with a plurality of the mounting assemblies 120 described above can substantially reduce inadvertent shock, vibration and/or other loads on the electronics board 118 that may occur in use.

Figure 4B:
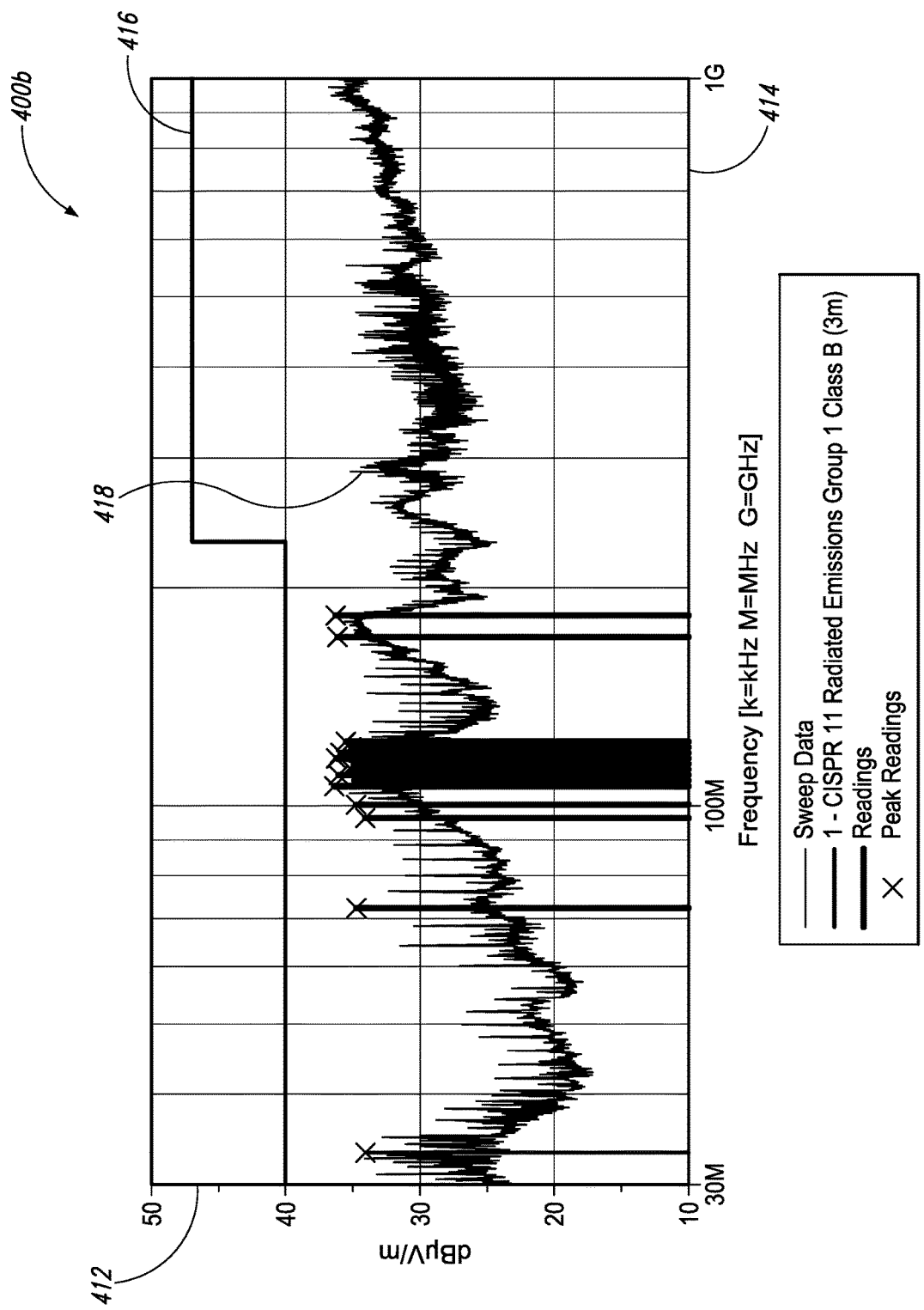
FIG. 4B is a graph illustrating electrical shielding test results of the electronics board mounting system in accordance with embodiments of the present technology.

FIG. 4B is a graph 400b illustrating radiated emissions test results of the electronics board mounting system 101 configured in accordance with embodiments of the present technology. A vertical axis 412 of the graph 400b measures radiated emissions in volts per meter (V/m), and a horizontal axis 414 measures frequency of the emissions in Hertz (Hz).

A first plot line 416 illustrates the radiated emissions limits as a function of frequency required to meet FCC Class B regulations. A second plot line 418 illustrates measured radiated emissions from the electronics board 118 during operation. As can be seen from the second plot line 418, the radiated emissions from the electronics board 118 are substantially below the limits required by the Class B regulations. Accordingly, use of the electronics board mounting assemblies 120 described herein can provide effective means of isolating the electronics board 118 and its components from shock, vibration, and/or strain loads, while also providing robust electrical ground connections between the electronics board 118 and the enclosure 110 to reduce radiated emissions, EMI, and/or other performance-degrading occurrences.

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment. Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples and embodiments of the invention is not intended to be exhaustive or to limit the invention to the precise form disclosed above. While specific examples for the invention are described above for illustrative purposes, various equivalent modifications are possible within the scope of the invention, as those skilled in the relevant art will recognize. The teachings of the invention provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements. Further any specific numbers noted herein are only examples: alternative implementations may employ differing values or ranges.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or in a continuing application.

I claim:

1. An electronic device comprising:
   an enclosure including a first cover and a second cover coupled to the first cover;
   an electronics board having a conductive surface portion; and
   a mounting assembly to support the electronics board in the enclosure between the first cover and the second cover, the mounting assembly including an elastic support member coupled to the electronics board proximate to the conductive surface portion, the elastic support member including a first surface, a second surface coupled to the first surface, a through hole between the first surface and the second surface and a plurality of elastically deformable features positioned in an annular arrangement around the through hole on the first surface and extending from the first surface towards the electronics board.

2. The electronic device of claim 1, wherein the elastic support member comprises a bushing portion that includes additional deformable features extending radially outward from a center of the bushing portion.

3. The electronic device of claim 1, further comprising:
   an additional elastic support member coupled to the electronics board opposite to the elastic support member, the additional elastic support member including additional deformable features projecting toward the elastic support member.

4. The electronic device of claim 1, further comprising:
   a grounding member coupled to the electronics board, the grounding member including a distal portion that projects towards the conductive surface portion to form at least a portion of a ground path from the conductive surface portion to the first cover.

5. The electronic device of claim 1, wherein the electronics board includes a first side, a second side opposite the first side, and a through hole between the first side and the second side, and wherein the conductive surface portion extends at least partially around the through hole.

6. The electronics device of claim 1, wherein the first cover and the second cover at least partially form a Faraday cage around the electronics board.

7. The electronic device of claim 1, wherein:
the electronic device includes an ultrasonic imaging device; and
the electronics board carries at least one processing device configured to generate one or more visual images based on ultrasonic signals received by the ultrasonic imaging device.

8. A mounting assembly for mounting an electronics board, the mounting assembly comprising: an enclosure having a first cover and a second cover, an elastic support member that is configured to be coupled to the electronics board, the elastic support member including a first surface, a second surface coupled to the first surface, a through hole between the first surface and the second surface and a plurality of elastically deformable features positioned in an annular arrangement around the through hole on the first surface and extending from the first surface towards the electronics board.

9. The mounting assembly of claim 8, wherein the through hole is configured to receive a fastening element to fasten the elastic support member between the electronics board and the second cover.

10. The mounting assembly of claim 8, wherein the elastic support member comprises:
a bushing portion that includes additional deformable features extending radially outward from the through hole.

11. The mounting assembly of claim 8, wherein the elastic support member comprises channels extending radially from the through hole.

12. The mounting assembly of claim 8, further comprising:
an additional elastic support member that is configured to be coupled to the electronics board opposite to the elastic support member, the additional elastic support member including additional deformable features projecting toward the elastic support member.

13. The mounting assembly of claim 8, further comprising:
a grounding member that is configured to be coupled to the electronics board, the grounding member including a distal portion that projects towards the electronics board to at least partially form a ground path from the electronics board to the first cover.

14. The mounting assembly of claim 8, wherein the elastic support member is configured to be coupled to the electronics board proximate to a conductive surface portion on the electronics board.

15. A mounting system to reduce shock and electromagnetic interference for an electronics board, the mounting system comprising:
mounting assemblies to support the electronics board in an enclosure having a first cover and a second cover, at least one of the mounting assemblies including:
a mounting feature; and
an elastic support member coupled to the mounting feature, the elastic support member including a base portion, a bushing portion, a through hole extending through the base portion and the bushing portion, and a plurality of elastically deformable features positioned in an annular arrangement around the through hole on the base portion and extending from the base portion towards the electronics board.

16. The mounting system of claim 15, wherein
the bushing portion includes additional deformable features extending radially outward from the through hole.

17. The mounting system of claim 15, wherein the base portion comprises channels extending radially from the through hole.

18. The mounting system of claim 15, wherein the at least one of the mounting assemblies comprises an additional elastic support member that is configured to be coupled to the electronics board opposite to the elastic support member, the additional elastic support member including additional deformable features projecting toward the elastic support member.

19. The mounting system of claim 15, wherein the at least one of the mounting assemblies comprises a grounding member that is configured to be coupled to the electronics board, the grounding member including a distal portion that projects towards the electronics board to at least partially form a ground path from the electronics board to the first cover.

* * * * *